(12) United States Patent
Loh et al.

(10) Patent No.: US 7,943,952 B2
(45) Date of Patent: May 17, 2011

(54) METHOD OF UNIFORM PHOSPHOR CHIP COATING AND LED PACKAGE FABRICATED USING METHOD

(75) Inventors: Ban P. Loh, Durham, NC (US); Nicholas W. Medendorp, Jr., Raleigh, NC (US); Peter Andrews, Durham, NC (US); Yankun Fu, Raleigh, NC (US); Michael Laughner, Clayton, NC (US); Ronan Letoquin, Durham, NC (US)

(73) Assignee: Cree, Inc., Goleta, CA (US)

( * ) Notice: Subject to any disclaimer, the term of this patent is extended or adjusted under 35 U.S.C. 154(b) by 150 days.

(21) Appl. No.: 11/881,683

(22) Filed: Jul. 27, 2007

(65) Prior Publication Data
US 2008/0079017 A1  Apr. 3, 2008

Related U.S. Application Data

(60) Provisional application No. 60/834,671, filed on Jul. 31, 2006.

(51) Int. Cl.
*H01L 33/52* (2010.01)

(52) U.S. Cl. .......... 257/100; 257/98; 257/E33.059; 257/E33.073; 438/26

(58) Field of Classification Search .......... 257/98, 257/99, 100, E33.056, E33.059, E33.067, 257/E33.068, E33.073, 79, E33.061; 438/26, 438/29, 27; 313/512
See application file for complete search history.

(56) References Cited

U.S. PATENT DOCUMENTS

| | | | |
|---|---|---|---|
| 4,733,335 A | 3/1988 | Serizawa et al. | 362/503 |
| 4,918,497 A | 4/1990 | Edmond | 357/17 |
| 4,935,665 A | 6/1990 | Murata | 313/500 |
| 4,946,547 A | 8/1990 | Palmour et al. | 156/643 |
| 4,966,862 A | 10/1990 | Edmond | 437/100 |
| 5,027,168 A | 6/1991 | Edmond | 357/17 |
| 5,200,022 A | 4/1993 | Kong et al. | 156/612 |
| 5,210,051 A | 5/1993 | Carter, Jr. | 437/107 |
| 5,277,840 A | 1/1994 | Osaka et al. | 252/301.36 |
| 5,338,944 A | 8/1994 | Edmond et al. | 257/76 |
| RE34,861 E | 2/1995 | Davis et al. | 437/100 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,614,131 A | 3/1997 | Mukerji et al. | 264/1.9 |

(Continued)

FOREIGN PATENT DOCUMENTS

DE  102005062514  3/2007

(Continued)

OTHER PUBLICATIONS

Related Indian Patent Application No. 4867/DELNP/2005, first examination report dated: Apr. 4, 2008.

(Continued)

*Primary Examiner* — Victor Mandala
*Assistant Examiner* — Scott Stowe
(74) *Attorney, Agent, or Firm* — Koppel, Patrick, Heybl & Philpott

(57) ABSTRACT

Methods for fabricating LED packages comprising providing an LED chip and covering at least part of it with a liquid medium. An optical element is provided and placed on the liquid medium. The optical element is allowed to settle to a desired level and the liquid medium is cured. LED packages are also disclosed that are fabricated using the disclosed methods.

28 Claims, 3 Drawing Sheets

U.S. PATENT DOCUMENTS

| | | | | |
|---|---|---|---|---|
| 5,631,190 | A | 5/1997 | Negley | 438/33 |
| 5,739,554 | A | 4/1998 | Edmond et al. | 257/103 |
| 5,766,987 | A | 6/1998 | Mitchell et al. | 438/126 |
| 5,813,753 | A | 9/1998 | Vriens | 362/293 |
| 5,858,278 | A | 1/1999 | Itoh et al. | 252/301.4 R |
| 5,912,477 | A | 6/1999 | Negley | 257/95 |
| 5,923,053 | A | 7/1999 | Jakowetz et al. | 257/95 |
| 5,959,316 | A | 9/1999 | Lowery | 257/98 |
| 5,998,925 | A | 12/1999 | Shimizu et al. | 313/503 |
| 6,001,671 | A | 12/1999 | Fjelstad | 438/112 |
| 6,066,861 | A | 5/2000 | Horn et al. | 257/99 |
| 6,069,440 | A | 5/2000 | Shimizu et al. | 313/486 |
| 6,087,202 | A | 7/2000 | Exposito et al. | 438/113 |
| 6,120,600 | A | 9/2000 | Edmond et al. | 117/89 |
| 6,132,072 | A | 10/2000 | Turnbull et al. | 362/494 |
| 6,139,304 | A | 10/2000 | Centofante | 425/121 |
| 6,153,448 | A | 11/2000 | Takahashi et al. | 438/114 |
| 6,187,606 | B1 | 2/2001 | Edmond et al. | 438/46 |
| 6,201,262 | B1 | 3/2001 | Edmond et al. | 257/77 |
| 6,252,254 | B1 | 6/2001 | Soules et al. | 257/89 |
| 6,329,224 | B1 | 12/2001 | Nguyen et al. | 438/127 |
| 6,331,063 | B1 | 12/2001 | Kamada et al. | 362/237 |
| 6,338,813 | B1 | 1/2002 | Hsu et al. | 264/272.14 |
| 6,376,277 | B2 | 4/2002 | Corisis | 438/106 |
| 6,404,125 | B1 | 6/2002 | Garbuzou | 313/499 |
| 6,531,328 | B1 | 3/2003 | Chen | 438/26 |
| 6,583,444 | B2 | 6/2003 | Fjelstad | 257/82 |
| 6,624,058 | B1 | 9/2003 | Kazama | 438/612 |
| 6,642,652 | B2 | 11/2003 | Collins, III et al. | 313/512 |
| 6,653,765 | B1 | 11/2003 | Levinson | |
| 6,733,711 | B2 | 5/2004 | Durocher et al. | 264/272.14 |
| 6,759,266 | B1 | 7/2004 | Hoffman | 438/64 |
| 6,791,119 | B2 | 9/2004 | Slater, Jr. et al. | 257/99 |
| 6,793,371 | B2 | 9/2004 | Lamke et al. | 362/241 |
| 6,812,500 | B2 | 11/2004 | Reeh et al. | 257/98 |
| 6,853,010 | B2 | 2/2005 | Slater, Jr. et al. | 257/98 |
| 6,860,621 | B2 | 3/2005 | Bachl et al. | 362/373 |
| 6,919,683 | B1 | 7/2005 | Jang | 313/503 |
| 6,921,929 | B2* | 7/2005 | LeBoeuf et al. | 257/100 |
| 6,958,497 | B2 | 10/2005 | Emerson et al. | 257/94 |
| 7,023,019 | B2 | 4/2006 | Maeda et al. | 257/89 |
| 7,029,935 | B2 | 4/2006 | Negley et al. | |
| 7,049,159 | B2 | 5/2006 | Lowery | 438/22 |
| 7,183,587 | B2 | 2/2007 | Negley et al. | 257/99 |
| 7,202,598 | B2 | 4/2007 | Juestel et al. | 313/503 |
| 7,286,296 | B2 | 10/2007 | Chaves et al. | 359/641 |
| 2002/0001869 | A1 | 1/2002 | Fjelstad | |
| 2002/0006040 | A1 | 1/2002 | Kamada et al. | |
| 2002/0057057 | A1* | 5/2002 | Sorg | 313/512 |
| 2002/0070449 | A1 | 6/2002 | Yagi et al. | |
| 2002/0079837 | A1* | 6/2002 | Okazaki | 313/512 |
| 2002/0096789 | A1 | 7/2002 | Bolken | |
| 2002/0105266 | A1 | 8/2002 | Juestel et al. | |
| 2002/0123164 | A1 | 9/2002 | Slater, Jr. et al. | |
| 2002/0185965 | A1 | 12/2002 | Collins, III et al. | |
| 2003/0006418 | A1 | 1/2003 | Emerson et al. | |
| 2003/0038596 | A1 | 2/2003 | Ho | |
| 2003/0066311 | A1 | 4/2003 | Li et al. | |
| 2003/0121511 | A1 | 7/2003 | Hashimura et al. | |
| 2003/0207500 | A1 | 11/2003 | Pichler et al. | |
| 2004/0004435 | A1 | 1/2004 | Hsu | |
| 2004/0012958 | A1 | 1/2004 | Hashimoto | |
| 2004/0037949 | A1 | 2/2004 | Wright | |
| 2004/0038442 | A1 | 2/2004 | Kinsman | |
| 2004/0041222 | A1 | 3/2004 | Loh | |
| 2004/0056260 | A1 | 3/2004 | Slater, Jr. et al. | |
| 2004/0106234 | A1 | 6/2004 | Sorg et al. | |
| 2004/0164307 | A1 | 8/2004 | Mueller-Mach et al. | |
| 2005/0002168 | A1 | 1/2005 | Narhi et al. | |
| 2005/0006651 | A1* | 1/2005 | LeBoeuf et al. | 257/79 |
| 2005/0051782 | A1* | 3/2005 | Negley et al. | 257/79 |
| 2005/0072981 | A1* | 4/2005 | Suenaga | 257/88 |
| 2005/0196886 | A1 | 9/2005 | Jager et al. | |
| 2005/0211991 | A1 | 9/2005 | Mori et al. | |
| 2005/0221519 | A1* | 10/2005 | Leung et al. | 438/27 |
| 2005/0265404 | A1 | 12/2005 | Ashdown | |
| 2006/0001046 | A1 | 1/2006 | Batres et al. | |
| 2006/0091788 | A1 | 5/2006 | Yan | |
| 2006/0157721 | A1 | 7/2006 | Tran et al. | |
| 2007/0012940 | A1 | 1/2007 | Suh et al. | |
| 2007/0096131 | A1 | 5/2007 | Chandra | |
| 2007/0158669 | A1 | 7/2007 | Lee et al. | |
| 2008/0006815 | A1 | 1/2008 | Wang et al. | |
| 2008/0203410 | A1 | 8/2008 | Brunner et al. | |

FOREIGN PATENT DOCUMENTS

| | | | |
|---|---|---|---|
| EP | 0732740 | A2 | 9/1996 |
| EP | 1059678 | | 12/2000 |
| EP | 1138747 | | 10/2001 |
| EP | 1198016 | A2 | 4/2002 |
| EP | 1367655 | | 12/2003 |
| EP | 1385215 | A2 | 1/2004 |
| EP | 1724848 | A | 11/2006 |
| EP | 1724848 | A2 | 11/2006 |
| FR | 2704690 | | 11/1994 |
| FR | 2704690 | A | 11/1994 |
| JP | 2000002802 | | 1/2000 |
| JP | 2000208820 | A | 7/2000 |
| JP | 2002009097 | A | 1/2002 |
| JP | 2002-050799 | A | 2/2002 |
| JP | 2005033138 | A | 2/2005 |
| JP | 2005298817 | | 10/2005 |
| JP | 2006054209 | | 2/2006 |
| WO | WO 0124283 | A | 4/2001 |
| WO | WO 0124283 | A1 | 4/2001 |
| WO | WO 03/021668 | | 3/2003 |
| WO | WO 03021691 | A1 | 3/2003 |
| WO | WO 2005101909 | | 10/2005 |
| WO | WO 2006033695 | A2 | 3/2006 |
| WO | WO 2006036251 | A1 | 4/2006 |
| WO | WO 2007/018560 | | 2/2007 |
| WO | WO 2008003176 | A1 | 1/2008 |

OTHER PUBLICATIONS

Official Notice of Final Decision of Rejection re: related Japanese Patent Application No. 2007-533459, dated: Dec. 26, 2008.

Rejection Decision re: related Chinese Patent Application No. 200580031382.3, dated: Feb. 2, 2009.

Communication pursuant to Article 94(3) EPC re: related European Application No. 05808825.3, dated: Feb. 18, 2009.

Official Notice of Final Decision of Rejection re: related Japanese Patent Application No. 2007-533459, dated: Dec. 26, 2008.

Notice on Reexamination for Chinese Patent Application No. 200580031382.3 mailed May 28, 2010.

Patent Abstracts of Japan No. 2002-050799 dated Feb. 15, 2002 to Stanley Electric Co. Ltd.

Official Notice of Rejection Mailed Jul. 29, 2008, Japanese Patent Application No. 2007-533459.

Patent Abstracts of Japan 2004-221185 Aug. 5, 2004.

Patent Abstracts of Japan 11-040858, Feb. 12, 1999.

Patent Abstract of Japan 2001-181613, Jul. 3, 2001.

PCT Search Report and Written Opinion Oct. 31, 2007.

International Search Report for PCT/US2007/024367, Dated: Oct. 22, 2008.

Office Action from related U.S. Appl. No. 11/982,276, dated Dec. 7, 2009.

Office Action from related U.S. Appl. No. 12/077,638, dated; Dec. 8, 2009.

International Search Report and Written Opinion from related PCT Application No. PCT/US2009/001572, dated: Jul. 17, 2009.

Office Action re related U.S. Appl. No. 10/666,399, dated: Sep. 5, 2008.

PCT International Search Report and Written Opinion, PCT/US2007/024366,Date: Jul. 15, 2008.

Examination of related European Application No. 05 808 825.3-2203, Dated: Mar. 18, 2009.

From related application. Japanese Patent Application No. 2006-526964, Official Notice of Rejection, mailed Feb. 16, 2010.

Patent Abstracts of Japan, Publication No. 2003-258011 dated Sep. 12, 2003.

Patent Abstracts of Japan, Publication No. 2002-093830 dated Mar. 29, 2002.
Nichia Corp. White LED Part No. NSPW300BS, Specification for Nichia White LED, Model NSPW300BS Jan. 14, 2004.
Nichia Corp. White LED Part No. NSPW312BS, Specification for Nichia White LED, Model NSPW312BS Jan. 14, 2004.
Lau, John, "Flip-Chip Technologies", McGraw Hill, 1996.
International Materials Reviews "Materials for Field Emission Displays", A.P. Burden 2001.

NPO-30394 Electrophoretic Deposition for Fabricating Microbatteries p. 1-2, NASA Tech Briefs Issue May 3, 2003.
Official Notice of Rejection re related Japanese Patent Application No. 2007-533459, Dated: Jul. 29, 2008.
Patent Abstracts of Japan, Pub. No. 2001-181613, Date: Jul. 3, 2001.
Patent Abstracts of Japan, Pub. No. 11-040858, Date: Feb. 12, 1999.
Patent Abstracts of Japan, Pub. No. 2004-221185, Date: Aug. 5, 2004.

* cited by examiner

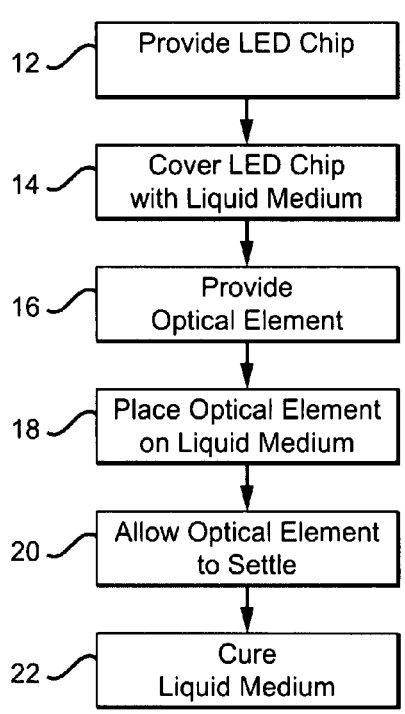
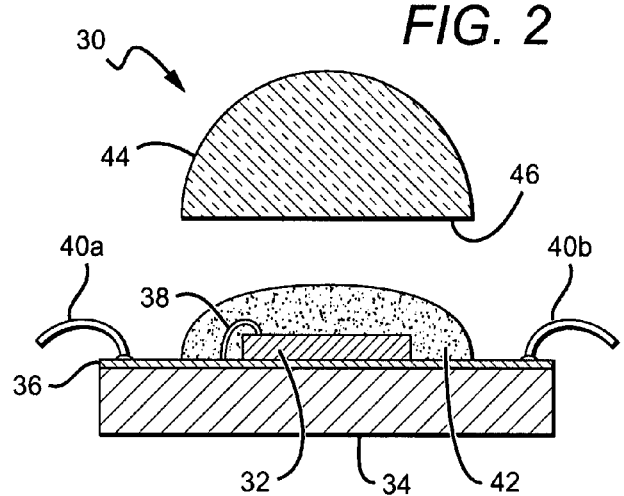
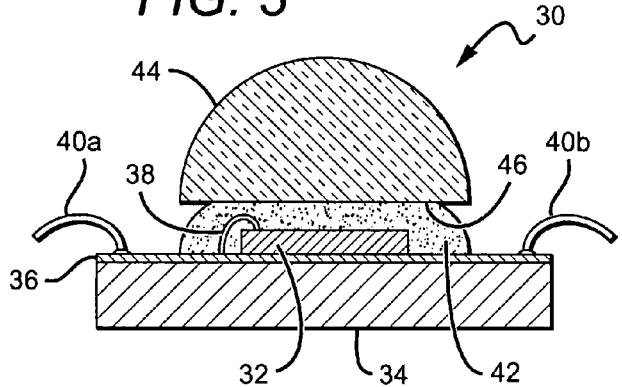

METHOD OF UNIFORM PHOSPHOR CHIP COATING AND LED PACKAGE FABRICATED USING METHOD

This application claims the benefit of U.S. Provisional Patent Application Ser. No. 60/834,671 to Loh et al., filed on Jul. 31, 2006.

BACKGROUND OF THE INVENTION

1. Field of the Invention

This invention relates to light emitting diodes (LED or LEDs) and more particularly to methods for coating LEDs with a conversion material and LED packages fabricated using the methods.

2. Description of the Related Art

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. One way to produce white light from conventional LEDs is to combine different colors from different LEDs. For example, the light from red, green and blue LEDs, or blue and yellow LEDs can be combined to produce white light.

Light from a single blue emitting LED chip has been converted to white light by surrounding the LED chip with a yellow phosphor, polymer or dye. [See Nichia Corp. white LED, Part No. NSPW300BS, NSPW312BS, etc., which comprise blue LEDs surrounded by a yellow phosphor powder; see also U.S. Pat. No. 5,959,316 to Lowery, entitled Multiple Encapsulation of Phosphor-LED Devices.] The surrounding material downconverts the wavelength of some of the LED light, changing its color. For example, a nitride based blue emitting LED chip can be surrounded by a yellow phosphor. Some of the blue emitted light can pass through the phosphor without being changed while the remaining light can be downconverted to yellow. The LED chip emits both blue and yellow light, which combine to produce white light. Another example of LEDs using this approach is disclosed in U.S. Pat. No. 5,813,753 to Vriens et al.

A common type of LED packaging where a phosphor is introduced over an LED is known as a "glob-in-a-cup" method. An LED chip resides at the bottom of a cup-like recession, and a phosphor containing material (e.g. phosphor particles distributed in an encapsulant such as silicone or epoxy) is injected into and fills the cup, surrounding and encapsulating the LED. The encapsulant material is then cured to harden it around the LED. This packaging, however, can result in an LED package having significant variation of the color and hue of emitted light at different viewing angles with respect to the package. This color variation can be caused by a number of factors, including the formation of a non-uniform layer of conversion and encapsulant on the LED surface that emits light. This problem can be made worse in packages where the phosphor containing matrix material extends above the "rim" of the cup in which the LED resides, resulting in a predominance of converted light emitted sideways into high viewing angles (e.g. at 90 degrees from the optic axis). The result is that the white light emitted by the LED package becomes non-uniform and can have bands or patches of light having different colors or intensities.

Another method for packaging or coating LEDs comprises direct coupling of phosphor particles onto the surfaces of the LED using methods such as electrophoretic deposition. This process uses electrostatic charge to attract phosphor particles to the surface of the LED chip that is charged. This "white chip" method can result in improvement of the color uniformity as a function of viewing angle with one reason for this improvement being the source of the converted light and unconverted light being at close to the same point in space. For example, a blue emitting LED covered by a yellow converting material can provide a substantially uniform white light source because the converting material and LED are at close to the same point in space. This, however, is typically a complex and costly method for achieving uniform phosphor coating directly on an LED. The phosphor particles are first suspended in a solvent and allowed to flow to the surface and remain attracted to the LED surface by the charge. The method can be slow, messy and can present inconsistencies due to difficulties in controlling electrostatic charges across many LEDs in a mass production environment.

Existing LED packages can also utilize a relatively large volume of encapsulant which can have a different coefficient of thermal expansion compared to the remaining LED package components, such as the reflector, circuitry substrate, optical elements, etc. This can put stresses on the components through the operating temperature cycle of the LED package that can result in reliability issues such as delamination of encapsulant from reflector or substrate walls, cohesive fracture within the encapsulant itself, and damage to LED chip wire bonds.

SUMMARY OF THE INVENTION

One embodiment of a method for fabricating a semiconductor device package according to the present invention, and in particular an LED package, comprises providing an LED chip and covering at least part of the LED chip with a liquid medium. An optical element is provided and the optical element is placed on the liquid medium and the optical element is allowed to settle to a desired level. The liquid encapsulant is then cured. In other embodiments the optical element can be placed at the desired level prior to curing.

One embodiment of light emitting diode (LED) package according to the present invention comprises a substrate with an LED chip mounted to the substrate in electrical contact with it. A cured medium is provided over the LED chip and an optical element having a bottom surface in contact with and optically coupled to the cured medium. The optical element is over the LED chip. The cured medium and optical element may have different coefficients of thermal expansion, with cured medium not laterally or horizontally constrained to allow expansion of the cured medium through thermal cycles.

Another embodiment of a light emitting diode (LED) package according to the present invention comprises a substrate and an LED chip mounted to the substrate and in electrical contact with the substrate. A cured encapsulant is included over the LED chip with the cured encapsulant being a liquid prior to curing. An optical element having a bottom surface is included in contact with and optically coupled to the cured encapsulant. The optical element is arranged over the LED chip at a desired level by depositing the cured encapsulant in liquid form over the LED chip, placing the optical element on the liquid encapsulant, allowing the optical element to settle, and curing the encapsulant.

These and other aspects and advantages of the invention will become apparent from the following detailed description and the accompanying drawings which illustrate by way of example the features of the invention.

BRIEF DESCRIPTION OF THE DRAWINGS

FIG. 1 is a flow diagram for one embodiment of a method for fabricating an LED package according to the present invention.

FIG. 2 is sectional view of one embodiment of an LED package according to the present invention having at in intermediate fabrication step.

FIG. 3 is a sectional view of the LED package in FIG. 2 after fabrication.

DETAILED DESCRIPTION OF THE INVENTION

Figure 4:
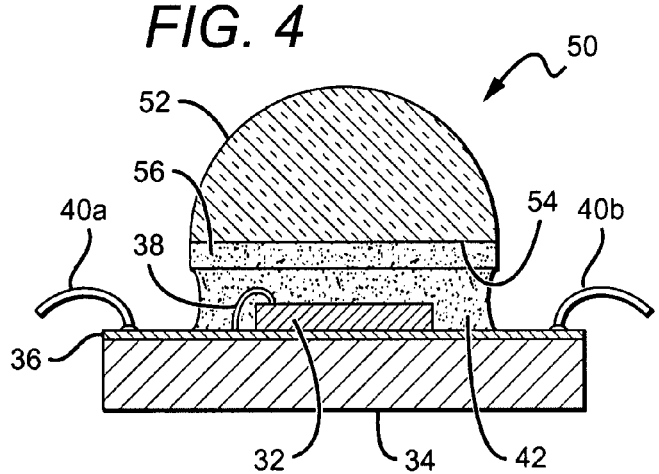
FIG. 4 is a sectional view of another LED package according to the present invention having a conversion material on its lens.

The present invention relates to methods for fabricating semiconductor chip packages, and in particular LED chip packages having substantially uniform phosphor coatings over their LED chips. The invention also relates to LED packages fabricated using the methods. In one method, a liquid is deposited over an LED chip and an optical element is placed on top of the liquid medium and allowed to settle on the liquid medium at the desired level. In one embodiment, the term settle refers to an equilibrium point reached between the lens and liquid medium where the lens stops moving down under the force of gravity. In other embodiments, the lens does not need to reach an equilibrium point, but instead, the liquid medium can be cured prior to the lens and liquid reaching an equilibrium.

The top surface of the liquid medium takes the shape of the bottom surface of the optical element, and the level of which the optical element settles is determined by a number of factors as described below. In other embodiments, the level can be set and fixed at a desired level to provide the desired thickness in the liquid medium. This arrangement allows for control of both the thickness and shape of the liquid medium over the LED chip.

The liquid medium can comprise many different materials, with suitable materials being thermoset plastics, silicones or epoxies that can be cured or cross-linked such that the relative positions of all components within the assembly will not be altered by mishandling, vibrations or shock. This arrangement also allows for the LED chip to be optically coupled to the optical element at the chip or microscale level. This allows for the emission efficacy of the LED package to be higher as light rays are controlled within a relatively small space.

The present invention is described herein with reference to certain embodiments but it is understood that the invention can be embodied in many different forms and should not be construed as limited to the embodiments set forth herein. It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIG. 1 shows one embodiment of a method 10 for fabricating an LED package according to the present invention. Although the method 10 is described with reference to an LED package, it is understood that the method can be used to fabricate other semiconductor device packages. It is further understood that although the method 10 is shown as a series of steps, the steps can occur in different order and different steps can be employed. In one method according to the present invention, the LED package emits a white light such as by having a blue emitting LED chip covered by one or more phosphors that absorb at least some of the blue light and emit one or more different colors of light. The LED package emits a white light combination of light from the LED and the one or more phosphors.

In 12 an LED chip is provided. In different methods according to the present invention different LED chips can be provided, while in other embodiments more than one LED chip can be provided. In one embodiment, the LED chip is provided that has been mounted to a conventional circuit board. Circuit boards are generally known in the art and are discussed only briefly herein. The circuit board can have conductive traces and a mounting pad for the LED chip. The conductive traces are deposited using known techniques and are arranged to allow an electrical signal applied to the traces to, be transmitted to the LED chip. One of the traces is typically connected to the LED chip by a wire bond.

In other embodiments, the LED chip can be mounted to a surface mount substrate which are also generally known in the art and only briefly discussed herein. In one embodiment, the surface mount substrate can comprise a ceramic core with conductive traces deposited on surfaces of the core. The traces can be made of a conductive material such as plated copper and can be deposited using known techniques. The surface mount substrate is arranged to be mounted to a final fixture using solder reflow processes known in the art. Like the circuit board, an electrical signal applied to the traces can be transmitted to the LED chip, with one of the traces typically connected to the LED chip by a wire bond. In still other embodiments, the LED can be mounted on other substrates or on other submounts.

In 14 a liquid encapsulant is provided over the LED chip, with the liquid medium preferably comprising a curable liquid encapsulant such as thermoset plastics, silicones or epoxies. In the embodiment with the LED chip on a circuit board, the liquid medium is provided over the LED chip and on the circuit board, with the liquid medium having a circuit board contacting surface. The liquid medium can be a clear, substantially transparent material, and can include light conversion phosphors and/or scattering particles described below.

The present invention utilizes known liquid mediums having known properties, and it is understood that the amount of liquid medium used to achieve the desired level of the optical element after settling is determined by a number factors. These factors include, but are not limited to: size of the LED package; optical element's weight; surface tension between the liquid medium, the optical element and the circuit board; and density of the liquid medium. Based on the description of the invention herein, the amount of a liquid medium for a particular LED package can be determined by those skilled in the art without undue experimentation.

To assist in holding the liquid medium over the LED chip, a meniscus holding feature or meniscus ring can be included on the circuit board, around the LED chip. Meniscus forming features generally comprise a physical transition that is arranged so that a meniscus forms by surface tension between a liquid and the physical transition. The term "meniscus" refers to the convex surface of liquid which is formed by surface tension. The physical transitions can be features such as edges, corners, ledges, trenches, rings, and any other physical transition that creates a meniscus when a liquid surface comes in contact with it. The meniscus holding features are primarily described herein as meniscus rings, but it is understood that the meniscus holding features can have many different shapes such as square or oval with these shapes influencing the overall shape of the liquid held by the feature. As the liquid medium is provided over the LED chip, the meniscus between the medium and meniscus ring holds the medium in a substantially hemispheric shape over the LED chip.

In other embodiments, a meniscus holding feature or lens retention feature can be incorporated into the substrate or submount that supports the LED chip (mechanically and electrically). This feature can comprise a mechanical barrier that can contain an index matching fluid and can also provide protection from lateral forces. This feature can act as a retention wall for an optical element or lens (described below). The index matching fluid can also be adhesive to adhere to the lens and hold it in place. Different commercially available compounds can be used for the index matching material and it can be dispensed within the retention feature using known methods. The lens retention feature can also be used to a lens, with the meniscus between the feature and a liquid lens material forming the material in a dome. The lens material can then be cured. The lens retention feature can be fabricated using known methods, such as by removing material from the substrate or submount such as by etching, ablating or milling. Alternatively, material can be built up on the substrate or submount such as by plating, bonding or soldering.

In 16 an optical element is provided that can have many different shapes and sizes. In one embodiment the optical element comprises a lens having a substantially hemispheric shape, while in other embodiments the lens can be disc shaped. The lens can also comprise a phosphor, scattering or diffusant material on one of its surfaces and/or optical elements or dispersed throughout the lens, as more fully described below. In other embodiments the LED chip can be covered by a phosphor layer that can also include scattering or diffusant materials. In other embodiments the optical element can comprise a microlens having a bottom surface that can be flat, textured or shaped such as with curved or concave areas.

In 18, the optical element can be placed on the liquid encapsulant, and in the case of a hemispheric optical element, the bottom flat surface can be placed in contact with the encapsulant. In the case of a disc shaped optical element, one of the circular flat surfaces can be placed in contact with the liquid medium. In 20, the optical element is allowed to settle on the liquid encapsulant to its desired level. In other embodiments, physical spacers can be included on the one the surfaces of the substrate with the lens settling on of the spacers to define the level of the optical element over the LED chip. In step 22, the liquid encapsulant is cured and hardened to hold the lens and protect the LED chip and its wire bonds. Different known curing methods can be used such as heat or UV curing.

The optical element, cured liquid medium and circuit board, can be made of materials having different coefficients of thermal expansion (CTE). LED packages according to the present invention are arranged to minimize damage to the LED package from these CTE mismatches. The materials for the cured medium can have a larger CTE compared to the surrounding elements in the package. As the cured medium expands and contracts through the thermal cycles, the optical element and cured medium are not constrained, which allows the lens to "float" up and down with expansion and contraction of the cured medium.

FIG. 2 shows one embodiment of an LED package 30 according to the present invention, comprising an LED chip 32. The details of operation and fabrication of conventional LED chips are also generally known in the art and are only briefly discussed. Conventional LEDs can be fabricated by known methods, with a suitable method being fabrication by Metal Organic Chemical Vapor Deposition (MOCVD). In operation, an electrical signal can be applied across the LED's oppositely doped layer causing the LED's active region to emit light.

The LED chip 32 is mounted to a substrate (or submount) 34 using known techniques, and as described above, the substrate can be a circuit board or surface mount substrate, or other substrates. The substrate 34 in FIG. 2 is shown as a circuit board with conductive traces 36 to apply an electrical signal to the LED chip 32. The LED chip 32 can be electrically coupled to a mounting pad or one of the conductive traces 36 through its surface in contact with the circuit board and through a wire bond 38 that is connected between the LED chip 32 and one of the conductive traces 36. It is understood that the LED chip 32 can also be electrically connected to the circuit board using different arrangements depending on factors such as the LED chip geometry and layout of the conductive traces 36. It is further understood that in other embodiments the LED chip is not in electrical contact with the substrate. The LED package 30 can also comprise first and second conductors or wires 40a, 40b for applying an electric signal to the conductive traces that can then transmitted to the LED chip 32. In embodiments having a surface mount substrate, electrical signals can be applied to the substrate through surface mount connections.

A liquid medium 42 is dispensed over the LED chip 32, and as described above a suitable liquid medium 42 can be a thermoset plastic, silicone or epoxy. The liquid medium can form and be held over the LED chip 32 by the surface tension between the liquid medium and the substrate 34. In other embodiments meniscus holding feature or meniscus ring can be included that hold the liquid medium in a substantially hemispheric shape over said LED chip 32, as more fully described below. (see FIG. 9).

The liquid medium can also comprise light conversion materials, such as light conversion phosphors. In one embodiment according to the present invention the LED chip 32 emits light in the blue wavelength spectrum and the phosphor absorbs some of the blue light and re-emits yellow. The LED package 30 emits a white light combination of blue and yellow light. A full range of broad yellow spectral emission is possible using conversion particles made of phosphors based on the $(Gd,Y)_3(Al,Ga)_5O_{12}$:Ce system. The following lists some additional suitable phosphors used as conversion particles in an LED package 30, although others can be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4:Eu^{2+}$
$Ba_2(Mg,Zn)Si_2O_7:Eu^{2+}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$ Red
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3:Pr^{3+},Ga^{3+}$
$CaAlSiN_3:Eu^{2+}$
$Sr_2Si_5N_8:Eu^{2+}$ The conversion particles can have different concentrations in the liquid medium 42 depending on the conversion efficiency of the particles. The conversion particles can be uniformly dispersed in the liquid medium 42, or the particles can settle around the LED so that the particles are closer to the LED. The liquid medium can also contain materials to help scatter light, such as scattering particles.

The LED package 30 further comprises an optical element 44 that can have many different shapes and sizes such as hemispheric, bullet or disk shaped. The optical element 44 as shown is a hemispheric shaped lens with a substantially flat bottom surface 46, and is shown prior to settling on the liquid medium according to the present invention.

FIG. 3 shows the LED package 30 in FIG. 2 after the optical element 44 is placed on the liquid medium with the bottom surface contacting the liquid medium. The optical element preferably settles above the LED chip 32 and its wire bond 38, without contacting or interfering with the operation of either and as described above, the level at which the LED settles can be controlled by considering a number of different factors. The liquid medium is then cured to hold the optical element 44 in place and to protect the LED chip 32 and its wire bond 38.

FIG. 4 shows another embodiment of an LED package 50 according to the present invention having many of similar elements to the LED package 30 in FIGS. 2 and 3. For these similar elements herein the same reference number from FIGS. 2 and 3 will be used with the understanding that the description of those references from above applies to the references herein. The LED package 50 comprises an LED chip 32 mounted on a substrate (circuit board) 34 with conductive traces 36. The LED chip also comprises at least one wire bond 38, first and second conductors 40a, 40b, and a now cured medium 42.

The LED package further comprises a hemispheric shaped optical element 52 having a substantially flat bottom surface 54. The optical element also comprises a layer of phosphor material 56 deposited on the bottom surface 54, although the layer can also be on other surfaces. The phosphor material 56 preferably comprises phosphor particles as described above. The phosphor material 56 is arranged to absorb at least some of the light emitting from the LED chip and convert it to another wavelength of light. The liquid medium 42 can be clear or can comprise conversion particles and or scattering particles that work in conjunction with the conversion material so that the LED package emits the desired color of light.

The optical elements of LED packages according to the present invention can also comprise optical designs including but not limited to diffractive optics and Fresnel optics. These design optics allow light to be captured within a short distance from the LED chip providing for the desired optical performance of the LED package. The bottom surface of the optical elements can also be textured or shaped to enhance light extraction.

Figure 5:
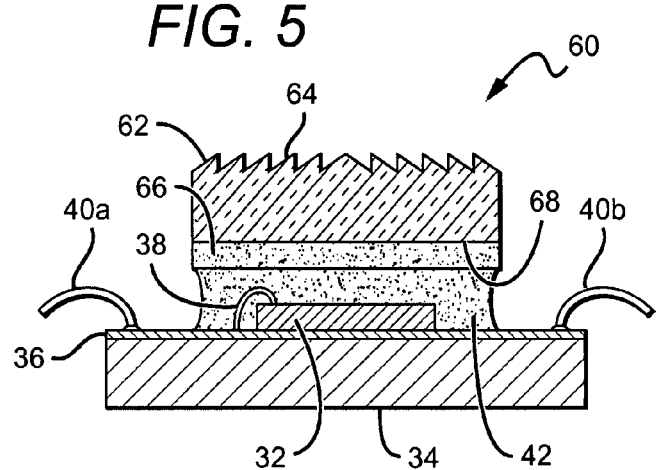
FIG. 5 is a sectional view of another LED package according to the present invention having a disc shaped lens.

FIG. 5 shows another embodiment of an LED package 60 according to the present invention having an optical design on its optical element. The LED package 60 comprises an LED chip 32 mounted on a substrate (circuit board) 34 with conductive traces 36. The LED chip also comprises at least one wire bond 38, first and second conductors 40a, 40b, and a cured medium 42. The package 60 further comprises a disc shaped optical element 62 over the liquid medium 42 that, during package fabrication, is allowed to settle over the LED chip 32 and wire bond 38 at the level shown. The top surface of the optical element 62 comprises an optical design on its top surface 64 such as Fresnal optics. The optical element 64 can also have a conversion particle layer 66 on its bottom surface 68.

As mentioned above, different embodiments of the LED package according to the present invention can also comprise scattering particles or diffusants such as Barium Sulfate or Titanium dioxide ($TiO_2$) particles. These scattering particles have a relatively high index of refraction (e.g. $TiO_2$ n=2.6 to 2.9) and are effective at scattering light. The scattering particles can be loaded in the liquid medium and dispensed on top of the LED chip before placement of the optical element.

Figure 6:
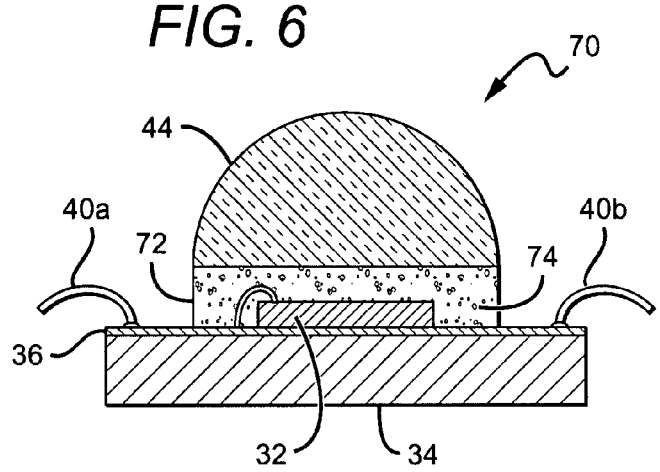
FIG. 6 is a sectional view of another embodiment of an LED package according to the present invention having scattering particles.

FIG. 6 shows another embodiment of an LED package 70 comprising an LED chip 32 mounted on a substrate (circuit board) 34 with conductive traces 36, a wire bond 38, first and second conductors 40a, 40b and lens 44. A cured medium 72 is included that is similar to the cured medium 42 described above in FIGS. 2 and 3, but is loaded with a diffusant or scattering particles 74 either alone or in combination with conversion particles. The particles can be made of many materials that diffuse or scatter light, with suitable materials being those described above. This arrangement is applicable to LED packages having a single LED chip, to provide for scattered and mixed light to form a more uniform light. This arrangement is also applicable to LED packages having multiple LEDs chips emitting different colors of light, such as red green and blue emitting LEDs. This light from the LEDs can be scattered and mixed to produce a white light.

Figure 7:
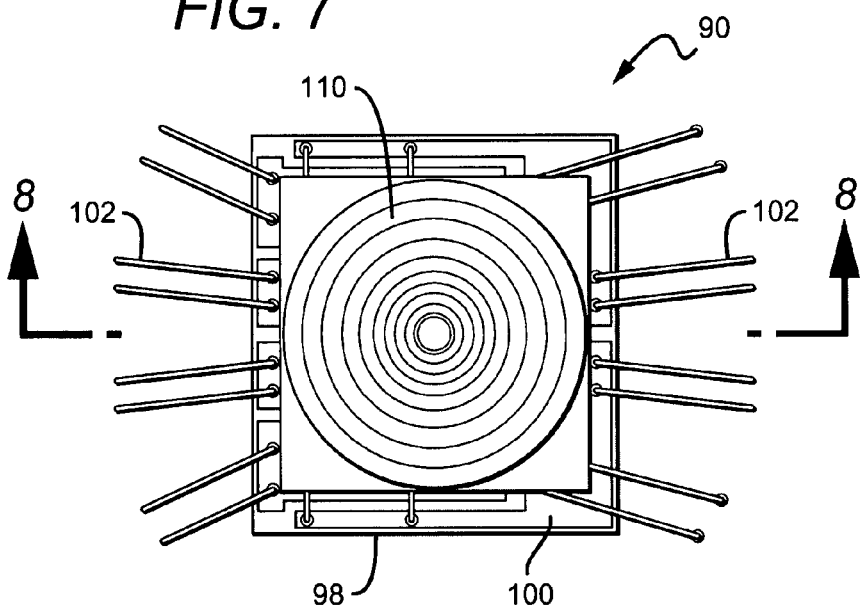
FIG. 7 is a plan view of another embodiment of an LED package according to the present invention having multiple LED chips.
Figure 8:
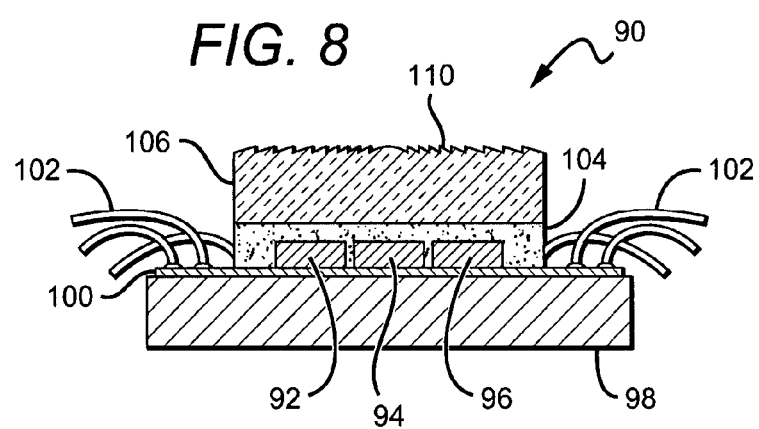
FIG. 8 is a sectional view of the LED package in FIG. 7 taken along section lines 8-8.

FIGS. 7 and 8 show one embodiment of a multiple LED chip package 90 according to the present invention comprising a red emitting LED chip 92, a blue emitting LED chip 94, and a green emitting LED chip 96 (shown in FIG. 8), all of which are mounted on a circuit board 98 having conductive traces 100. Each of the LED chips 92, 94, 96 are in electrical contact with the conductive traces to allow an electric signal to be applied to said LED chips 92, 94, 96 either individually or in unison. The LED package 90, however, does not have wire bonds. The LED chips 92, 94, 96 comprise two bottom contacts that are electrically coupled to the conductive features 100. This arrangement is particularly applicable to lateral geometry LED chips that can be flip chip mounted to the substrate. Each of the embodiments above can comprise an LED chip contacted to the substrate and its conductive traces without wire bonds.

The LED package 90 further comprises conductors or wires 102 connected to the conductive traces 100 to conduct electrical signals to the LED chips 92, 94, 96. A liquid medium 104 is included over the LED chips 92, 94, 96, and an optical element 106 is placed on the liquid medium 104 and allowed to settle at a level above the LED chips 92, 94, 96. The liquid medium 104 is then cured to hold the optical element and protect the LED chips 92, 84, 96. The liquid medium 104 can be loaded with conversion particles and/or scattering particles as described above. The scattering particles are particularly adapted to scattering and mixing the red, green and blue LED chip light to a uniform white light. The optical element 106 is similar to the optical element 62 in FIG. 5 and also has an optical design 110 on its top surface. In other embodiments the optical element can have other shapes as described above and can also be loaded with conversion particles and/or diffusant and scattering particles.

Figure 9:
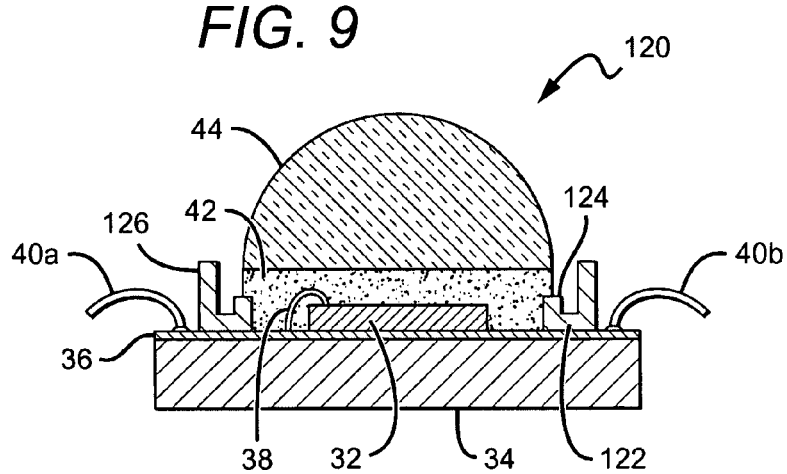
FIG. 9 is a sectional view of another embodiment of an LED package according to the present invention having a meniscus forming feature.

As mentioned above, LED packages according to the present invention can also comprise a physical spacer onto which the optical element settles after being placed on the liquid medium, with the physical spacer setting or fixing the level of the optical element. The LED packages can also comprise a meniscus ring to hold the liquid medium in a particular shape prior to placing the optical element. FIG. 9 shows another embodiment of an LED package 120 according to the present invention comprising an LED chip 32, substrate (circuit board) 34 with conductive traces 36, wire bond 38, first and second conductors 40a, 40b, liquid medium 42 and optical element 44, all of which are similar to the corresponding elements shown in FIGS. 2 and 3 and described above.

The LED package 120 further comprises a meniscus ring 122 having a meniscus holding feature 124 for forming a meniscus with the liquid medium 42. As the liquid medium 42 is provided over the LED chip 32, the meniscus between the medium 42 and meniscus holding feature 124 holds the medium 42 in a substantially hemispheric shape over the LED chip 32. The optical element 44 can them be placed on the liquid medium 42 and allowed to settle to the design level. The liquid medium 42 can then be cured. The meniscus ring can also comprise a lens retention feature 126 can be included to provide mechanical stability to the lens 44 to help hold it within the package 120 against lateral forces.

The package 120 can be arranged so that the lens 44 settles at a level above the meniscus holding feature 124 before the liquid medium 42 is cured. Alternatively, the meniscus holding feature 124 can serve as a spacer with the optical element 44 settling on the feature 124 to establish a physical set or fixed level for the optical element 44. A sufficient amount of liquid medium 42 can be included to fully cover the LED chip 32 and optically couple the optical element 44 to the liquid medium 42. It is understood that many different spacers can be used according to the present invention, some of which can only partially surround the LED chip 32. In other embodiments the spacer can be used that does not serve as a meniscus forming feature.

The present invention can be used for fabricating many different LED packages, including LED array packages having a plurality of LED chips mounted on a circuit board (or surface mount substrate) having conductive traces. LED chips and conductive traces are arranged so that an electric signal applied to the conductive traces is applied to the LED chips causing them to emit light. Each of the LED chips can be arranged with a liquid medium and optical element as described in the embodiments above.

Although the present invention has been described in detail with reference to certain preferred configurations thereof, other versions are possible. Therefore, the spirit and scope of the invention should not be limited to the versions described above.

We claim:

1. A method for fabricating an LED package, comprising:
    selecting an amount of a liquid medium;
    covering at least part of an LED chip with said liquid medium, said liquid medium directly contacting at least part of said LED chip;
    placing an optical element on said liquid medium;
    allowing said optical element to settle only on said liquid medium at a desired level; and
    curing said liquid medium;
    wherein said amount of said liquid medium relates to said desired level.

2. The method of claim 1, wherein said liquid medium comprises a material from the group thermoset plastics, silicones, and epoxies.

3. The method of claim 1, wherein said optical element comprises a lens.

4. The method of claim 1, wherein said optical element is optically coupled to said liquid medium.

5. The method of claim 1, further comprising providing a substrate and mounting said LED chip to said substrate.

6. The method of claim 1, wherein said liquid medium further comprises phosphors or diffusants.

7. The method of claim 1, further comprising a meniscus holding feature around said LED chip to hold said liquid medium in a desired shape prior to curing.

8. The method of claim 1, wherein said optical element further comprises a layer of conversion material.

9. The method of claim 1, wherein said optical element further comprises an optical design.

10. A light emitting diode (LED) package, comprising:
    a substrate;
    an LED chip mounted to said substrate;
    cured medium over said LED chip and directly adjacent to said substrate; and
    an optical element having a bottom surface optically coupled to and in direct contact only with said medium, said optical element held in place at a certain height above said LED chip by said medium, wherein said height relates only to the amount of said cured medium, and wherein said cured medium and said optical element have different coefficients of thermal expansion.

11. The LED package of claim 10, wherein said cured medium comprises a material from the group thermoset plastics, silicones, and epoxies.

12. The LED package of claim 10, wherein said optical element comprises a lens.

13. The LED package of claim 10, wherein said cured medium further comprises phosphors or diffusants.

14. The LED package of claim 10, further comprising a meniscus holding feature on said substrate and around said LED chip.

15. The LED package of claim 10, wherein said optical element further comprises a layer of conversion material.

16. The LED package of claim 10, wherein said optical element further comprises an optical design.

17. A light emitting diode (LED) package, comprising:
a substrate;
an LED chip mounted to said substrate;
cured encapsulant over said LED chip and directly contacting said substrate; and
an optical element having a bottom surface optically coupled to and in direct contact only with said encapsulant, said optical element held in place at a certain height above said LED chip by said encapsulant, wherein said height is directly related to the amount of said encapsulant.

18. The LED package of claim 17, wherein said cured encapsulant comprises a material from the group thermoset plastics, silicones, and epoxies.

19. The LED package of claim 17, wherein said optical element comprises a lens.

20. The LED package of claim 17, wherein said cured encapsulant further comprises phosphors or diffusants.

21. The LED package of claim 17, further comprising a meniscus holding feature on said substrate and around said LED chip.

22. The LED package of claim 17, wherein said LED chip is in electrical contact with said substrate.

23. The method of claim 1, wherein said curing is done prior to said optical element completely settling on said encapsulant.

24. The method of claim 1, wherein said curing is done after said optical element has completely settled on said encapsulant.

25. The LED package of claim 10, wherein said optical element is supported only by said medium.

26. The LED package of claim 10, wherein said optical element only contacts said medium.

27. The LED package of claim 17, wherein said optical element is only supported by said encapsulant.

28. The LED package of claim 17, wherein said optical element only contacts said encapsulant.

* * * * *